US006778122B2

(12) United States Patent
Lien

(10) Patent No.: US 6,778,122 B2
(45) Date of Patent: Aug. 17, 2004

(54) RESISTOR STRING DIGITAL TO ANALOG CONVERTER WITH DIFFERENTIAL OUTPUTS AND REDUCED SWITCH COUNT

(75) Inventor: Wee Liang Lien, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 10/328,158

(22) Filed: Dec. 23, 2002

(65) Prior Publication Data

US 2004/0119626 A1 Jun. 24, 2004

(51) Int. Cl.[7] .................................................. H03M 1/76
(52) U.S. Cl. ...................................... 341/154; 341/144
(58) Field of Search .............................. 341/144, 153, 341/154

(56) References Cited

U.S. PATENT DOCUMENTS

| | | | | |
|---|---|---|---|---|
| 4,647,903 A | * | 3/1987 | Ryu | 341/136 |
| 5,126,740 A | * | 6/1992 | Kawada | 341/144 |
| 5,175,548 A | * | 12/1992 | Kawada | 341/144 |
| 5,252,975 A | | 10/1993 | Yuasa et al. | 341/145 |
| 5,495,245 A | | 2/1996 | Ashe | 341/145 |
| 5,940,020 A | | 8/1999 | Ho | 341/145 |
| 6,049,300 A | * | 4/2000 | Shoval | 341/144 |
| 6,130,634 A | | 10/2000 | Wadsworth et al. | 341/144 |
| 6,163,289 A | * | 12/2000 | Ginetti | 341/145 |
| 6,297,759 B1 | | 10/2001 | Lewyn | 341/150 |

OTHER PUBLICATIONS

*Introduction to CMOS OP–AMPS and Comparators*, Copyright 1999 by John Wiley & Sons, New York, NY, pp. 218–221.
*Analog Integrated Circuit Design*, by David A. Johns et al., Copyright 1997, by John Wiley & Sons, Inc. , USA pp. 463–466.

* cited by examiner

Primary Examiner—Howard L. Williams
(74) Attorney, Agent, or Firm—George O. Saile; Stephen B. Ackerman

(57) ABSTRACT

Resistor string DAC's are known to utilize lots of area and slow in data conversion due to the large utilization of switches. The problem becomes worse when differential outputs are required in the conversion process. This invention describes a N-bit DAC architecture utilizing a substantially lower number of switches through a unique placement of tap-points in the resistor string and decode logic. Differential outputs share the same set of switches through 2 levels of decoding.

12 Claims, 7 Drawing Sheets

*Example of proposed architexture when N=4 (4-bit differential R-DAC)*

<u>Top level Diagram</u>

RESISTOR STRING DIGITAL TO ANALOG CONVERTER WITH DIFFERENTIAL OUTPUTS AND REDUCED SWITCH COUNT

FIELD OF THE INVENTION

The present invention relates to digital to analog converters (DAC's) and more particularly to resistor string type DAC's with differential outputs adopted for IC fabrication.

DESCRIPTION OF RELATED ART

Digital to analog converters are widely used in mixed-mode systems requiring monotonicity where the converter acts as an interface between the digital signal processing and analog signal processing components of such systems.

Differential DAC's are often seen in high-speed mixed-mode systems to reduce the common-mode voltage noise thereby enhancing the performance of the system.

A typical differential R-DAC is the one shown in FIG. 1, using a tree structure switch matrix providing inherent decoding, and thus eliminating the need for a digital decoder. It uses a resistor voltage divider network connected between two reference voltages (VREFP & VREFN) to generate a complete set of voltages.

Each resistor tap corresponds to a resistor value of R. It requires 2 jumps of switches (the upper one moving down by one R and the lower one moving up by one R) to achieve 1 LSB(least significant bit) jump for every code transition.

One drawback of this circuit includes high component count: $2^N$ resistors, $2 \times (2^{N+1}-2)$ switches which increase area utilization. N is the resolution of the D-to-A converter.

A second drawback is that the voltages selected must propagate through N levels of switches before reaching outputs AOUTP & AOUTN. The delay through the decoding network is a limiting factor on the conversion speed of the DAC.

Another often seen differential R-DAC is shown in FIG. 2 using a digital decoder 10. This configuration also uses a resistor voltage divider network 12 between two reference voltages to generate a complete set of voltages. The voltage drop across each resistor is equal to 0.5 least significant bit (LSB) of output voltage change. In this configuration all the switches are connected to the outputs. The output is sampled by a N-to-$2^N$ digital decoder 10, illustrated as switches Q(1), Q(2), ... Q($2^N$-1),Q($2^N$). Each switch taps a different point in the resistor string, so by closing a specific switch while other ones are open generates a unique analog voltage on node AOUTP & AOUTN. It requires 2 jumps of switches at a time to obtain 1 LSB jump.

The total number of switches required for this resistor string DAC with differential outputs is $2 \times (2^N) => (2^{N+1})$.

The main drawback of this circuit is that the $2^{N+1}$ switches resulting in a large capacitive load at the outputs, as well as large area utilization due to $2^N$ resistors and switches.

Other DAC's have been presented in the literature by:

[1] U.S. Pat. No. 6,297,759 by Lanny L. Lewyn, in which a DAC includes separate converter segments for converting the MSB's and the next NSB's of a digital word. The DAC provides a high conversion rate with very low glitch disturbance.

[2] U.S. Pat. No. 6,130,634 by Mark V. Wadshorth et,al, in which a R-DAC is presented with improved speed by tailoring the selection switch size to the node location.

[3] U.S. Pat. No. 5,495,245 by James J. Ashe, in which the number of resistors and switches required for a voltage scaling DAC is reduced by segmenting the voltage decrementing resistor string into two separate outer strings and an inner string.

[4] U.S. Pat. No. 5,252,975 by Tachio Yuassa et,al,in which DAC having 2 resistor networks:a high-order-bit side and a low-order-bit side which operate in response to high-order bits of a digital input signal and low-order bits thereof.

[5] Analog Integrated Circuit Design by David A. Johns and Ken Martin, showing Nyquist-Rate D/A Converters categorized in 4 main categories: decoder-based,binary-weighted, thermometer-code, and hybrid pp 433–466.

However none achieve low area utilization, due to large reduction of switches and faster conversion speed due to lesser parasitic capacitance in the signal path.

SUMMARY OF THE INVENTION

It is an object of one embodiment of the present invention to show a resistor string DAC architecture with differential outputs sharing the same set of switches through 2 levels of decoding.

It is another object of the present invention to show a reduction in the number of switches through a unique placement of tap points in the resistor string and the decoding logic.

These objects are achieved by using two switching networks one with a plurality of $2^{N-1}+2$ switches coupled to a first resistor string that provides a selectable tap from the resistor string to two inner nodes, and a second comprised of 4 switches coupled to the two inner nodes for connecting to the output terminals of the D/A converter.

DESCRIPTION OF THE PREFERRED EMBODIMENT

Figure 3:
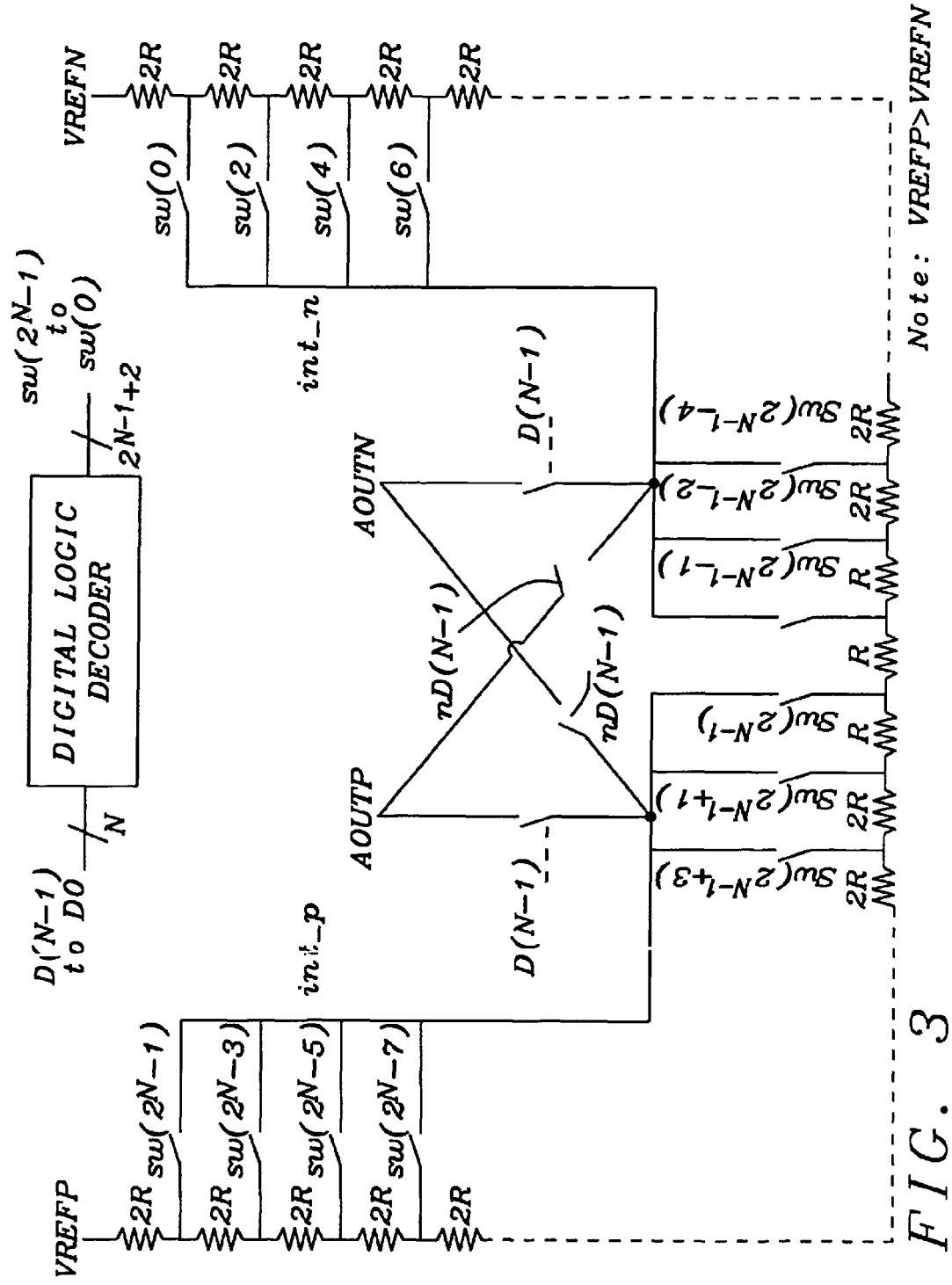
FIG. 3 is a diagram of the present invention-resistor string DAC with differential outputs sharing the same set of switches through 2 levels of decoding.
Figure 4A:
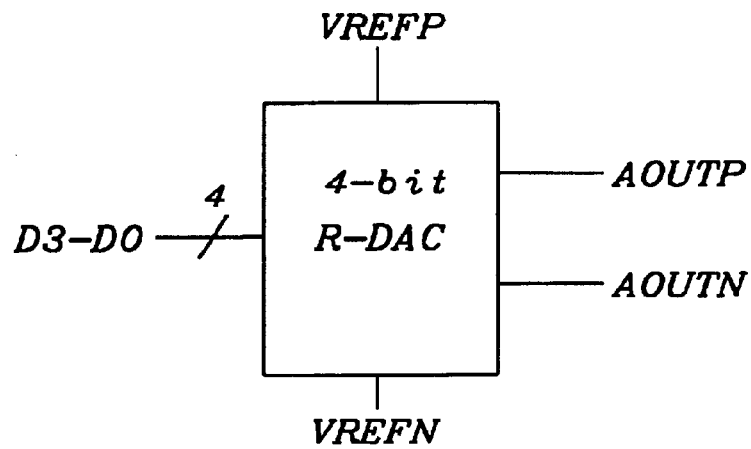
FIG. 4a is a top level diagram of the proposed architecture when applied to a N=4 (4-bit differential R-DAC).
Figure 4B:
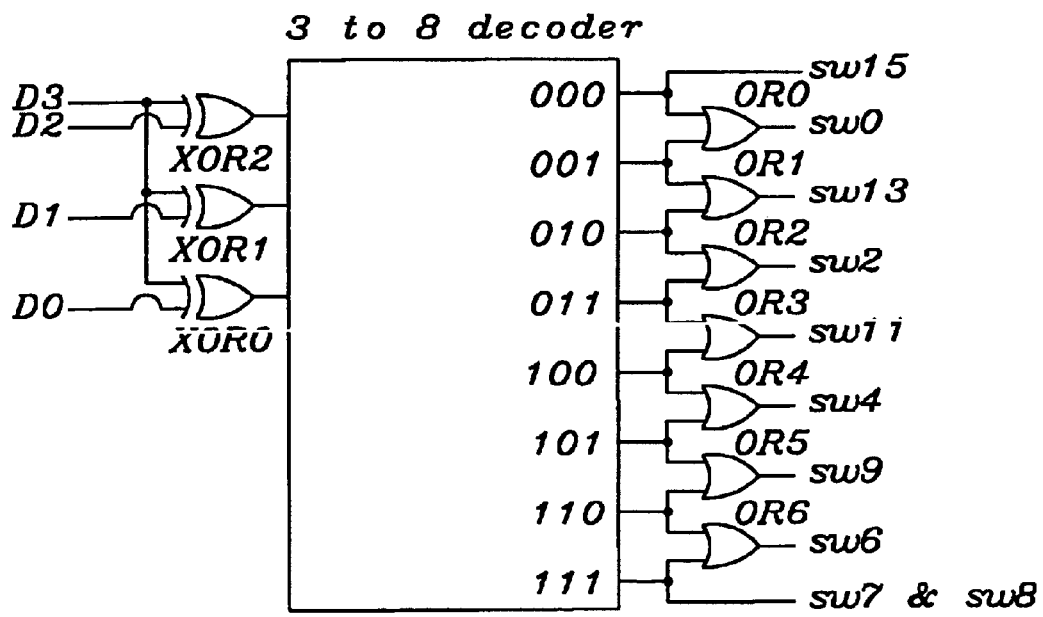
FIG. 4b is a diagram of the implementation of the 4:10 digital logic decoder.
Figure 4C:
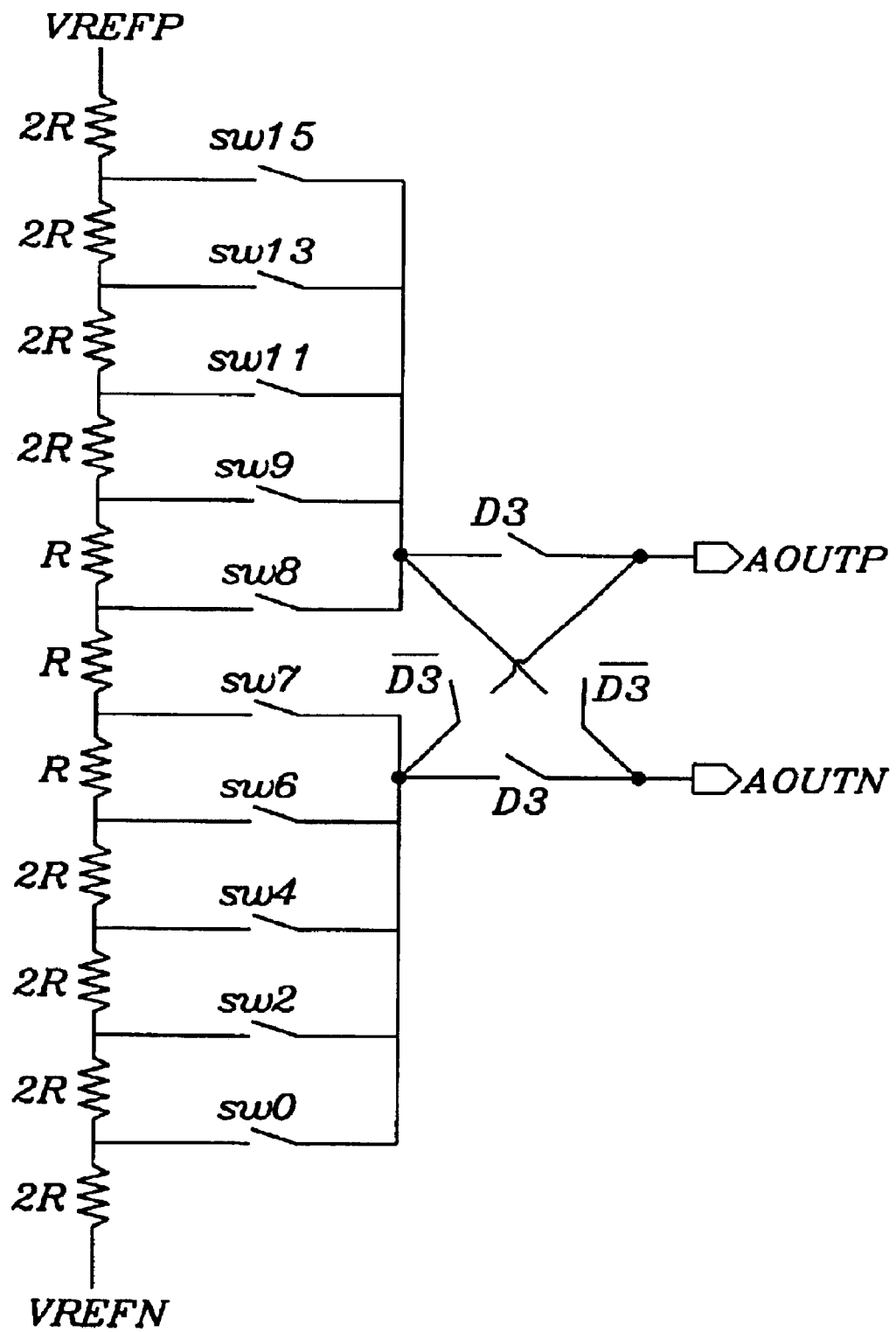
FIG. 4c is a diagram of the resistor string for a 4 bit differential R-DAC with the appropriate resistor taps and switches.

A resistor string of the type shown in FIG. 3, is connected between a high reference voltage VREFP and a low reference voltage VREFN. The resistor string is comprised of three sections: an upper-half, a center and a lower-half.

The upper-half consists of $0.5 \times (2^{N-1})$ series connected resistors of equal resistance values 2R, with switched taps from the junctions of successive resistors, the center section consists of 3 series connected resistors of equal resistance value 1 R, with switched taps from the junctions of successive resistors, and the lower-half consists of $0.5 \times (2^{N-1})$ series connected resistors of equal resistance value 2R, with switched taps from the junctions of successive resistors.

The opposite ends of the "sw" switches from said upper-half resistor string section are all connected together to internal node int_p, the opposite ends of the "sw" switches from said lower-half resistor string section are all connected together to internal node int_n, the opposite end of the "sw" switch from one side of the middle resistor of center section string is connected to internal node int_p, while the opposite end of "sw" switch from second side of the middle resistor of the center section string is connected to internal node_n.

Figure 5:
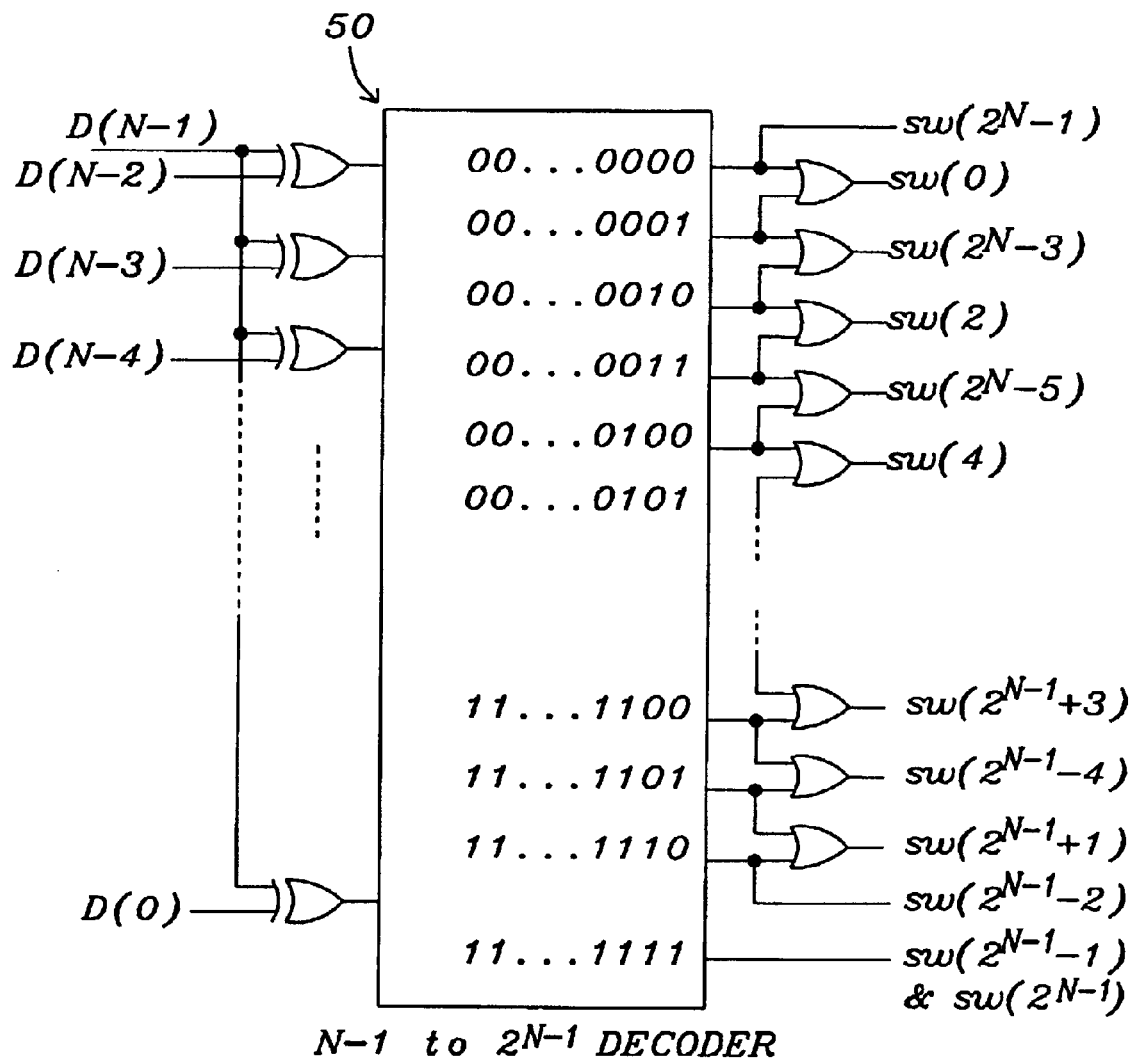
FIG. 5 is a diagram of the digital logic decoder, comprising a standard (N-1) to ($2^{N-1}$) decoder. The usage of XOR gates at the inputs allows decoding for the entire digital range.
Figure 6:
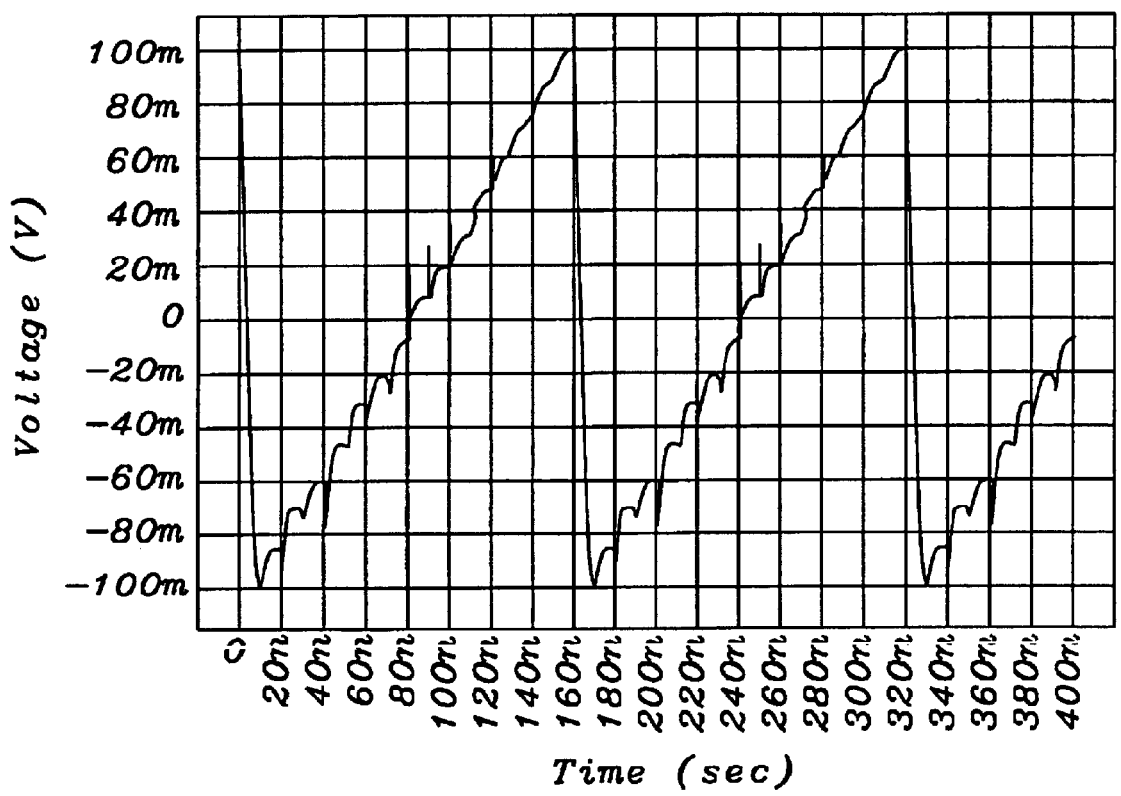
FIG. 6 shows the simulation results of a 4–bit DAC with the proposed architecture with digital inputs D<3:0> cycling 0000 through 1111. The plot shows the differential outputs (AOUTP-AOUTN) vs. time, and as can be seen the functionality of the DAC is retained.

Each switch is controlled by signals derived from a digital logic decoder 50 shown in FIG. 5 The digital decoding logic shown in FIG. 5 comprises N-bit inputs and provides $2^{N-1}+2$ outputs for the first level of decoding.

Since nodes int_p and int_n are separated, the parasitic capacitance seen by the signal path for the differential outputs is reduced.

At the second level of decoding, only 4 switches are required to share the upper and lower half of the resistor string between output nodes AOUTP and AOUTN.

Figure 1:
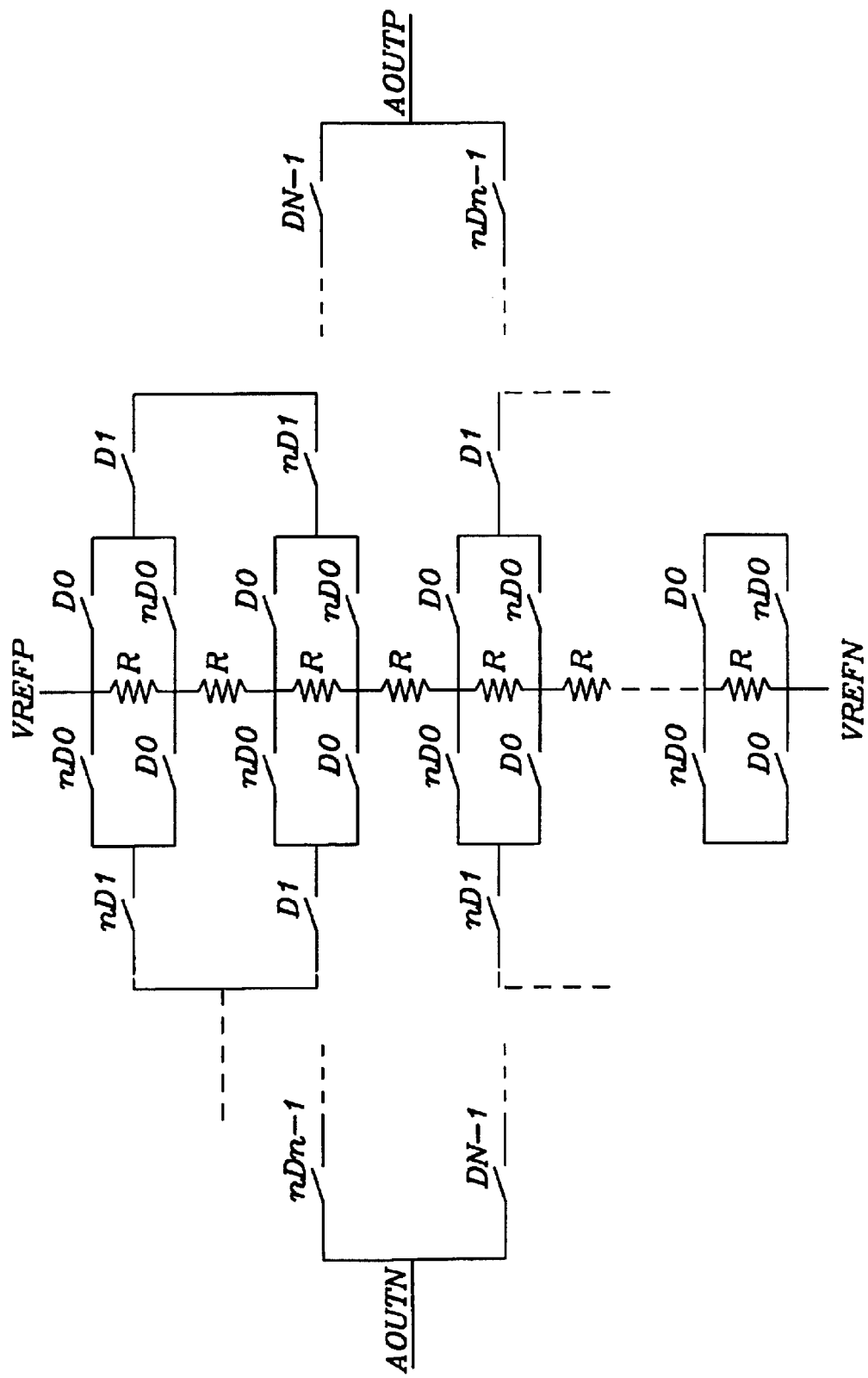
FIG. 1 is a diagram of prior art—resistor string DAC with differential outputs using tree decoder.
Figure 2:
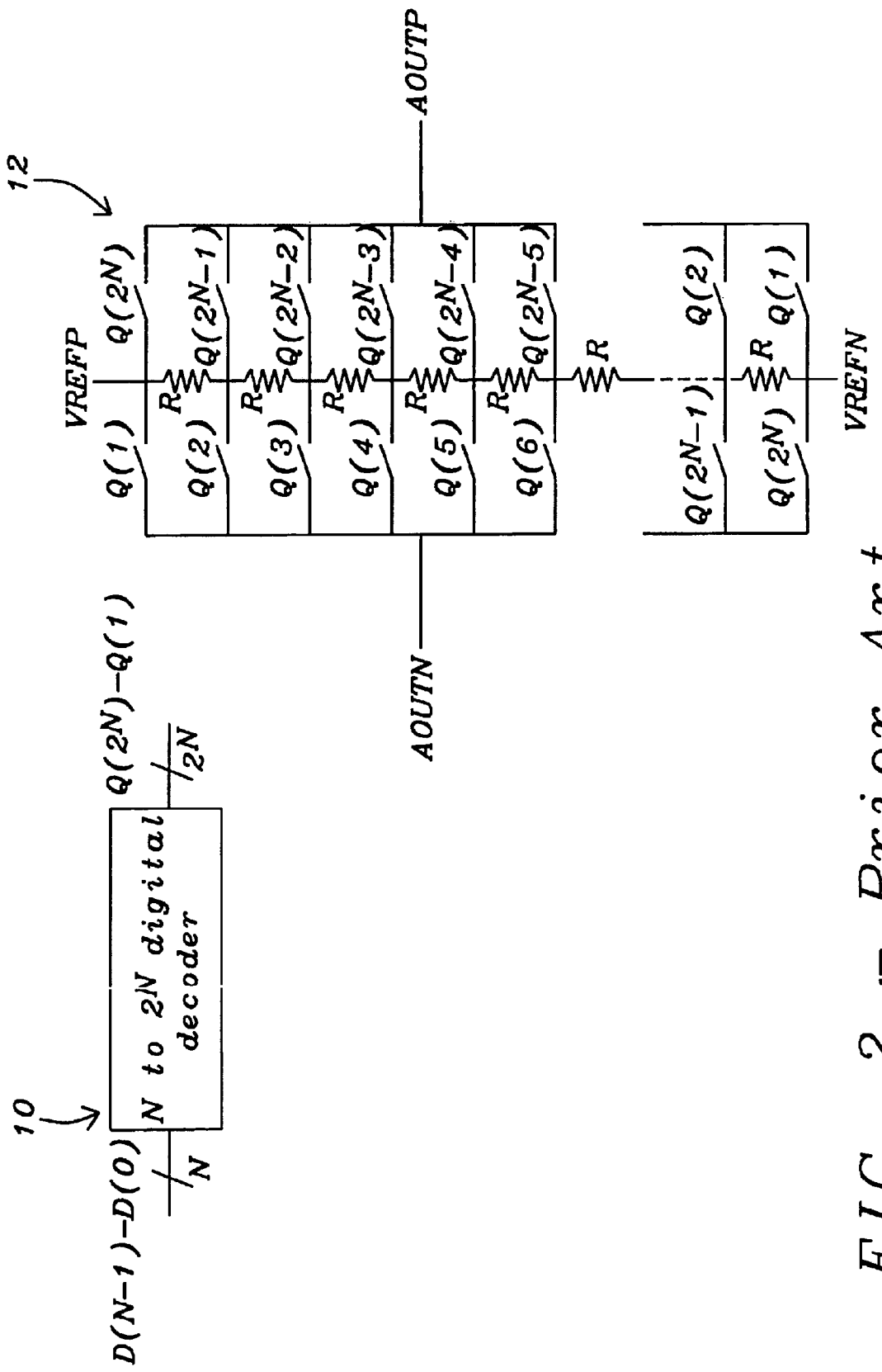
FIG. 2 is a diagram of prior art—resistor string DAC with differential outputs using digital logic decoder.

Signal nodes int_p and int_n are connected to the DAC outputs depending on the logic value of the MSB (most significant bit) D(N−1) and its complement nD(N−1). This unique technique shares the same set of switches (for various tap points) among AOUTP and AOUTN avoiding the need to replicate another set of switches as seen in prior art of FIG. 1 and FIG. 2.

The total number of switches required to control a N-bit DAC is $(2^{N-2})+(2^{N-2})+2+4= (2^{N-1})+6$.

The voltage across "2R" resistor is equivalent to 1 LSB (least significant bit) value and subsequently the voltage across one "1R" is equivalent to 0.5 LSB value. The resolution of the N-bit DAC using this architecture is 1 part in $2^N$.

The proposed architecture requires only one jump of switches (either the upper one moving down by "2R", or the lower one moving up by "2R") for each code transition. It is only in the center section of the three resistors of value R each that both "sw" switches will open/close at the same time. This is to facilitate the consistency of the digital decoding logic, as well as to make it "symmetrical". The unique way of tapping resistors combined with the digital logic decoder allows reduction of switch count by about 50%.

The advantage of inherent monotonicity in digital to analog conversion is still guaranteed by the architecture.

Analog outputs being differential also improves the power supply rejection ratio (PSRR) to a certain extent.

Area utilization is smaller due to large reduction of switches as seen in table below:

|  |  | Prior Art #1 | Prior Art #2 | Proposed Architecture |
|---|---|---|---|---|
| Number of Switches | N 8 | $(2^{N+1} - 2) \times 2$ 1020 | $2 \times 2^N$ 512 | $2^{N-1} + 6$ 134 |
| Decode logic |  | not required | N to $2^N$ | N − 1 to $2^{N-1}$ |

Maximum deviation of the analog output from the ideal value known as integral nonlinearity (INL) as well as the maximum deviation of the analog output step from the ideal value of 1 LSB known as Differential nonlinearity (DNL), gain error and offset error performance are similar to prior art: no degradation due to this unique configuration.

In summary the present invention of R-DAC with differential outputs with its significant reduction in the number of switches, and the two levels of decoding, translate in large savings of silicon area, and faster speed of conversion.

What is claimed is:

1. A differential resistor string digital to analog converter (R-DAC) architecture for an N-bit digital signal, comprising:
   high and low analog reference voltage nodes;
   two analog output nodes;
   a resistor string comprised of upper, center and lower sections of predetermined series connected resistors, one end of the resistor string being connected to said high reference voltage node and the other end connected to the low reference voltage node;
   a first switching network comprising a plurality of $2^{N-1}+2$ switches coupled to said resistor string to provide a selectable tap from said resistor string to two separate inner nodes; and
   a second switching network comprising 4 switches coupled to said two separate inner nodes, for connecting to the output terminals of the D/A converter.

2. The R-DAC of claim 1, wherein the upper and lower section of the resistor string comprise a combined total of $(2^{N-2} \times 2)$ resistors each having a resistance equal to 2R and where N is an integer equal to the number of bits.

3. The R-DAC of claim 1, wherein the voltage across any resistor in said string of value 2R is equivalent to 1 least-significant-bit (LSB).

4. R-DAC of claim 1, wherein the voltage across any resistor in said string of value 1R is equivalent to ½ LSB.

5. R-DAC of claim 1, wherein the middle resistor string section comprises 3 resistors each having a resistance equal to R.

6. R-DAC of claim 1, wherein said D/A converter includes a decoder means for producing control signals to switch said plurality of switches.

7. A R-DAC of claim 2, wherein digital decoder logic is reduced from conventional N to $2^N$ to N−1 to $2^{N-1}$ by usage of XOR gates at the inputs, thus allowing for the decoding of the entire digital range.

8. A R-DAC of claim 1, wherein the sharing of switches for differential outputs through the said second switching network is obtained by the use of the most significant bit (MSB) input.

9. A method of generating a differential analog output voltage from a resistor string digital to analog converter comprising the steps of:
   providing a switching circuit comprised of a plurality of resistors coupled to one another in series and further including a plurality of switches, each one of said plurality of resistors being coupled to at least a different one of said plurality of switches;

generating a voltage to switch said switching circuit and produce an analog output voltage:

wherein the plurality of resistors is comprised of an upper, middle and lower section;

the upper and lower section comprises $0.5 \times (2^{N-1})$ resistors in series each of equal values 2R and the middle section comprises 3 resistors in series of equal value of 1 R.

10. The method of claim 9 wherein $2^{N-1}+2$ switches couple to said resistor string thus providing a selectable tap from said resistor string to two internal nodes.

11. The method of claim 9 wherein 4 switches couple to said internal nodes, for connecting to the output terminals of the D/A converter.

12. The method of claim 9, wherein a digital decoder logic produces control signals to switch said plurality of $2^{N-1}+2$ switches.

* * * * *